(12) United States Patent
Mohanasundaram et al.

(10) Patent No.: US 11,956,916 B2
(45) Date of Patent: Apr. 9, 2024

(54) COMPUTING UNIT FOR A HPC CABINET AND A METHOD FOR ACCESSING AN ELECTRONIC COMPONENT OF THE COMPUTING UNIT

(71) Applicant: BULL SAS, Les Clayes-sous-Bois (FR)

(72) Inventors: Sakthivel Mohanasundaram, Thanjavur (IN); Mohanakumara Prakasha, Karnataka (IN)

(73) Assignee: BULL SAS, Les Clayes-sous-Bois (FR)

( * ) Notice: Subject to any disclaimer, the term of this patent is extended or adjusted under 35 U.S.C. 154(b) by 0 days.

(21) Appl. No.: 17/720,668

(22) Filed: Apr. 14, 2022

(65) Prior Publication Data
US 2022/0346261 A1 Oct. 27, 2022

(30) Foreign Application Priority Data

Apr. 27, 2021 (EP) .................................. 21170712

(51) Int. Cl.
| | |
|---|---|
| *H05K 7/14* | (2006.01) |
| *G06F 1/20* | (2006.01) |
| *H05K 5/02* | (2006.01) |
| *H05K 7/20* | (2006.01) |

(52) U.S. Cl.
CPC ............. *H05K 7/1487* (2013.01); *G06F 1/20* (2013.01); *H05K 5/0221* (2013.01); *H05K 7/1407* (2013.01); *H05K 7/1489* (2013.01); *H05K 7/1492* (2013.01); *H05K 7/20136* (2013.01); *H05K 7/20145* (2013.01); *H05K 7/20163* (2013.01)

(58) Field of Classification Search
CPC .. H05K 7/1407; H05K 7/1487; H05K 7/1489; H05K 7/1492; H05K 7/20; H05K 7/20009; H05K 7/20136; H05K 7/20145; H05K 7/20163; H05K 7/20718; H05K 7/20727; H05K 7/20736; G06F 1/20
See application file for complete search history.

(56) References Cited

U.S. PATENT DOCUMENTS

| | | | | |
|---|---|---|---|---|
| 9,025,326 B1 * | 5/2015 | Xu | ........ | G11B 33/128 361/679.33 |
| 10,349,547 B1 * | 7/2019 | Ayala Vera | .......... | H05K 7/1488 |
| 10,362,705 B2 * | 7/2019 | Bailey | .................. | H05K 7/1487 |

(Continued)

OTHER PUBLICATIONS

European Search Report issued in EP21170712.0, dated Oct. 8, 2021 (3 pages).

*Primary Examiner* — Adrian S Wilson
*Assistant Examiner* — Gage Crum
(74) *Attorney, Agent, or Firm* — ARC IP Law, PC; Joseph J. Mayo

(57) ABSTRACT

A computing unit configured to be mounted in a HPC cabinet, the computing unit comprising an external body, and an internal body comprising secondary electronic components. The internal body is releasably coupled with the external body in order to allow extraction of the internal body when the external body is secured fixedly to the HPC cabinet. The internal body includes a bottom tray, comprising bottom secondary electronic components, a top tray comprising at least one duct for conducting an air flow from the front to the rear, and a plurality of manual coupling members, accessible from the top of the top tray, releasably coupling the top tray with the bottom tray.

11 Claims, 4 Drawing Sheets

(56) References Cited

U.S. PATENT DOCUMENTS

| | | | |
|---|---|---|---|
| 10,568,229 B1* | 2/2020 | Ng | H05K 5/03 |
| 10,963,023 B1* | 3/2021 | Zheng | G06F 1/20 |
| 11,240,930 B2* | 2/2022 | Zheng | H05K 7/20727 |
| 11,439,045 B2* | 9/2022 | Korolenko | H05K 7/20727 |
| 2011/0014861 A1* | 1/2011 | Tsai | H01L 23/467 |
| | | | 454/184 |
| 2014/0016265 A1 | 1/2014 | Saito et al. | |
| 2014/0146471 A1* | 5/2014 | Liu | H05K 7/20727 |
| | | | 454/284 |
| 2016/0143164 A1* | 5/2016 | Wang | H05K 5/0221 |
| | | | 403/325 |
| 2017/0311474 A1 | 10/2017 | Raisoni | |
| 2020/0359520 A1* | 11/2020 | Rogers | H05K 7/1401 |
| 2021/0076532 A1* | 3/2021 | Sung | H05K 7/20009 |

\* cited by examiner

COMPUTING UNIT FOR A HPC CABINET AND A METHOD FOR ACCESSING AN ELECTRONIC COMPONENT OF THE COMPUTING UNIT

This application claims priority to European Patent Application Number 21170712.0, filed 27 Apr. 2021, the specification of which is hereby incorporated herein by reference.

BACKGROUND OF THE INVENTION

Field of the Invention

Embodiments of the invention relate, in general, to a high-performance computing and, more specifically, to a computing unit for a high-performance computing cabinet.

A datacenter comprises several high-performance computing cabinets, called HPC cabinets or "clusters", arranged in rows within the datacenter and configured to house computing units, such as servers, switches and routers, to organize, process and store data. Each computing unit comprises conventionally at least one mother board and several components secured to the mother board such as processors, Dual In-Line Memory Module (DIMM), a PCIe component (GPU, FPGAs)), fans, etc.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together. However, users face several issues which either require a maintenance activity to be carried out on the computing units and may often include replacement of few components in the computing units.

A HPC cabinet comprises traditionally two vertical side walls delimiting a central cavity with a front opening, so as to define vertically stacked sockets having a standard height (U). A computing unit is configured to be housed in the HPC cabinet and mounted onto the two vertical side walls. The height of the computing device is usually comprised between 1 U and 6 U.

Each vertical side wall comprises a front portion which is configured to cooperate with an abutment wall of the computing unit. Usually, the front portion of each side wall comprises threaded openings and the abutment wall of the computing unit comprises screws which are configured to be screwed into the threaded openings so that the computing unit is secured fixedly to the HPC cabinet. Besides its mechanical mounting, each computing unit is also connected to a power distribution unit, known as PDU, and to a network thanks to a management node (not represented) located within the HPC cabinet.

A computing unit comprises generally a bottom tray on which are mounted the components and a top tray comprising ventilation ducts so that fresh air, coming from the front, can be delivered to the rear of the computing unit.

Currently, in order to access a faulty electronic component of the bottom tray, the user must unscrew the computing unit from the HPC cabinet and remove the computing unit from the HPC cabinet. Then, the user must unscrew the top tray from the bottom tray to access the components. As a summary, a user must invest a large amount of time by using multiple tools (screw drivers, etc.), which renders replacement activity complex. Using multiple tools demand knowledge of use of such tools to prevent any damage. As such, user ergonomics and convenience may be affected, thereby violating principles of customer replaceable unit (CRU).

Accordingly, it is one object of one or more embodiments of the invention to provide a user-friendly computing unit which reduces effort and time to be invested by the user.

BRIEF SUMMARY OF THE INVENTION

The invention related to a computing unit configured to be mounted in a High-Performance Computing cabinet, thereafter HPC cabinet, defining a plurality of vertically stacked sockets, the computing unit according to one or more embodiments comprising:
  an external body, comprising primary electronic components, configured to engage with at least one of the sockets, the external body comprising at least a bottom wall and two lateral walls defining a housing opened from the front, each lateral side comprising an abutment wall configured to be secured directly to the HPC cabinet, the external body comprising at least a first connector connected to the primary electronic components,
  an internal body, comprising secondary electronic components, the internal body being releasably coupled with the external body in order to allow extraction of the internal body when the external body is secured fixedly to the HPC cabinet, the internal body comprising at least a second connector connected to the secondary electronic components, the second connector being configured to cooperate with the first connector when the internal body is coupled with the external body,
  the internal body comprising:
    a bottom tray, comprising bottom secondary electronic components,
    a top tray comprising at least one duct for conducting an air flow from the front to the rear and
    a plurality of manual coupling members, accessible from the top of the top tray, coupling releasably the top tray with the bottom tray.

In at least one embodiment of the invention, the internal body can be removed from the external body and the top tray can be uncoupled from the bottom tray. Even if the computing unit is very compact, each component can be accessible by a user without requiring tools to perform maintenance. The removal of the top tray is easy and practical since the internal body and the top tray can be moved without using tool and without removing the external body.

According to one or more embodiments of the invention, at least one coupling member, preferably two, is a lock rotating member, most preferred, a thumb screw. In at least one embodiment, said lock rotating member is located in a front portion of the top tray. In an embodiment, the bottom tray comprises at least one through hole for cooperating with the lock rotating member. A lock rotation member performs an efficient locking and allow tightening the top tray to the bottom tray.

According to one or more embodiments of the invention, at least one manual coupling member, preferably two, is a vertical pushing/pulling member. In at least one embodiment, said vertical pushing/pulling member is located in a rear portion of the top tray. The vertical pushing/pulling member is preferably in the form of a spring actuated plunger. Such a coupling member can be easily actuated even if the accessibility is more difficult. A simple pushing/pulling requires only one finger of the user.

According to one or more embodiments of the invention, the top tray comprises at least one handle, preferably two handles located at two opposite sides. The top tray can therefore be lifted without difficulty.

In at least one embodiment, a manual coupling member is located at each corner of the top tray so that the connection is robust to limit vibration. In at least one embodiment, the top tray is passive and is exempted of electronic components.

One or more embodiments of the invention relate also to a method for accessing a secondary electronic component of the bottom tray of the internal body of a computing unit as presented before, the internal body being located in the housing of the external body, the method comprising:

Pulling the internal body out from the housing of the external body, the bottom secondary electronic component of the bottom tray being covered by the top tray and Uncoupling the top tray from the bottom tray of the internal body by manually acting on the plurality of coupling members in order to access the bottom secondary electronic component of the bottom tray.

BRIEF DESCRIPTION OF THE DRAWINGS

A better understanding of embodiments of the invention (including alternatives and/or variations thereof) may be obtained with reference to the detailed description of the embodiments along with the following drawings, in which.

DETAILED DESCRIPTION OF THE INVENTION

Reference will now be made in detail to specific embodiments or features, examples of which are illustrated in the accompanying drawings. Wherever possible, corresponding or similar reference numbers will be used throughout the drawings to refer to the same or corresponding parts. Moreover, references to various elements described herein are made collectively or individually when there may be more than one element of the same type. However, such references are merely exemplary in nature. It may be noted that any reference to elements in the singular may also be construed to relate to the plural and vice-versa without limiting the scope of the invention to the exact number or type of such elements unless set forth explicitly in the appended claims.

According to one or more embodiments, a datacenter comprises several high-performance computing cabinets, called HPC cabinets or "clusters", arranged in rows within the datacenter and configured to house computing units, such as servers, switches and routers, to organize, process and store data. A HPC cabinet is configured to accommodate multiple server units, switches, cords and cables, rails, cable management bars, routers, path panels, and blanking panels.

High performance computing has gained importance in recent years by several industries which are trending towards increasing sizes or combinations of two or more servers to achieve faster processing performance for a large number of processing operations. Solutions known to address such requirement of the industries include Ultra Path Interconnect (UPI) technology which provides a scalable multiprocessor system, for example, by linking motherboards of two or more computing units together.

Figure 1:
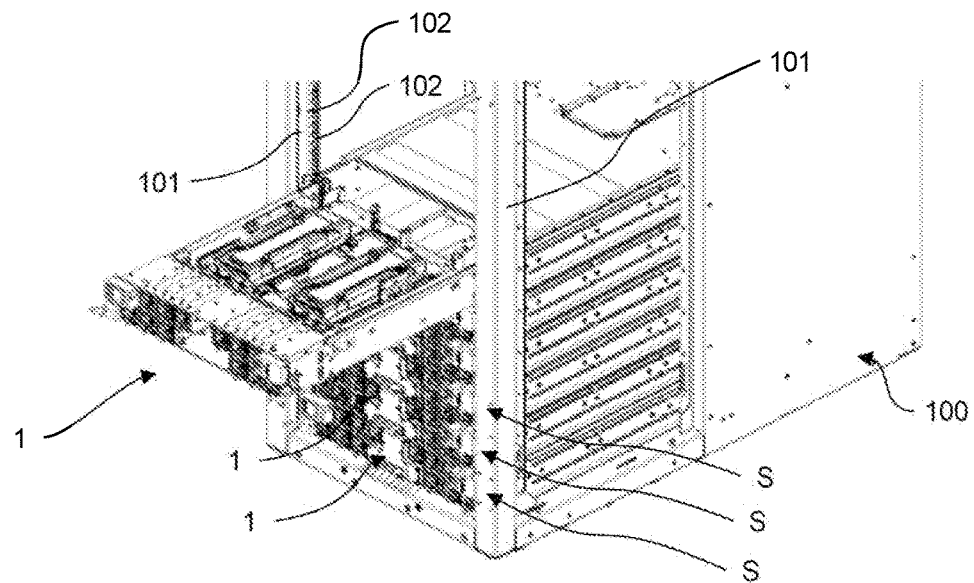
FIG. 1 is an isometric view of a HPC cabinet comprising several computing units, according to one or more embodiments.

As illustrated in FIG. 1, according to one or more embodiments, a HPC cabinet 100 comprises two vertical side walls 101, delimiting a central cavity with a front opening, so as to define vertically stacked sockets S having a standard height (U). Several computing units 1 are housed in the HPC cabinet 100 and mounted onto the two vertical side walls 101. In at least one embodiment, the height of each computing device 1 is 2U but could be different.

Each vertical side wall 101 comprises a front portion which is configured to cooperate with an abutment wall of a computing unit 1. In at least one embodiment, the front portion of each side wall 101 comprises threaded openings 102. Such an HPC cabinet 100 is known from the prior art and won't be further detailed.

A computing unit 1 according to one or more embodiments of the invention will be now presented. In at least one embodiment, as represented in FIGS. 2, 3 and 4, the computing unit 1 comprises an internal body 3 mounted within an external body 2, the internal body 3 being releasably coupled to the external body 2 in order to allow extraction of the internal body 3 when the external body 2 is fixedly secured to the HPC cabinet 100.

Figure 2:
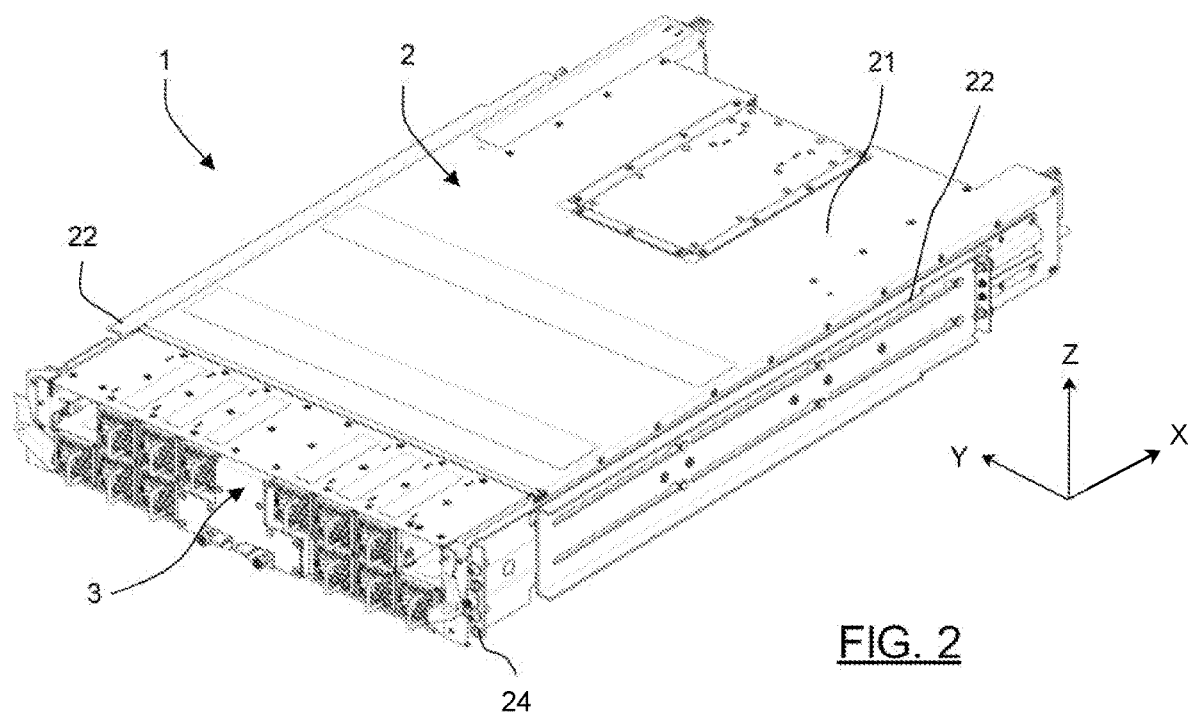
FIG. 2 is an isometric view of a computing unit, according to one or more embodiments.
Figure 3:
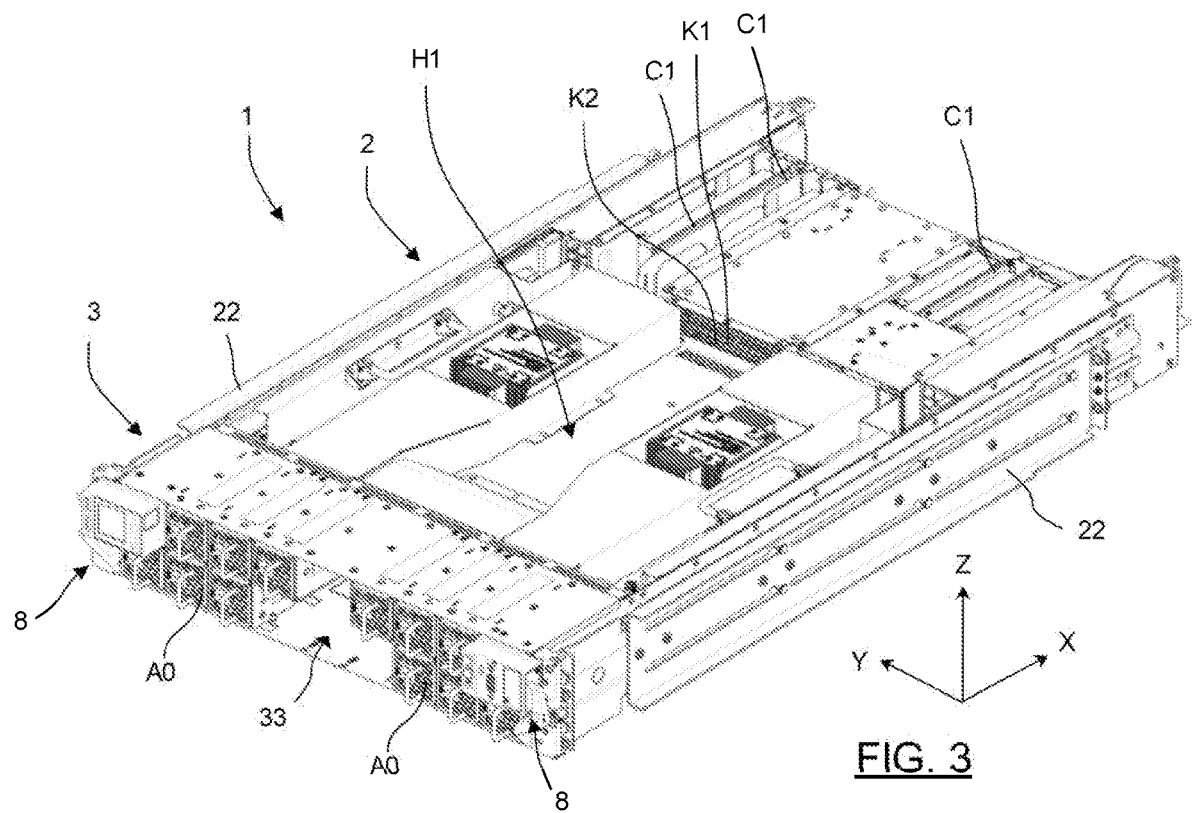
FIG. 3 is an isometric view of the computing unit from FIG. 2 without the top wall of the external body, according to one or more embodiments.
Figure 4:
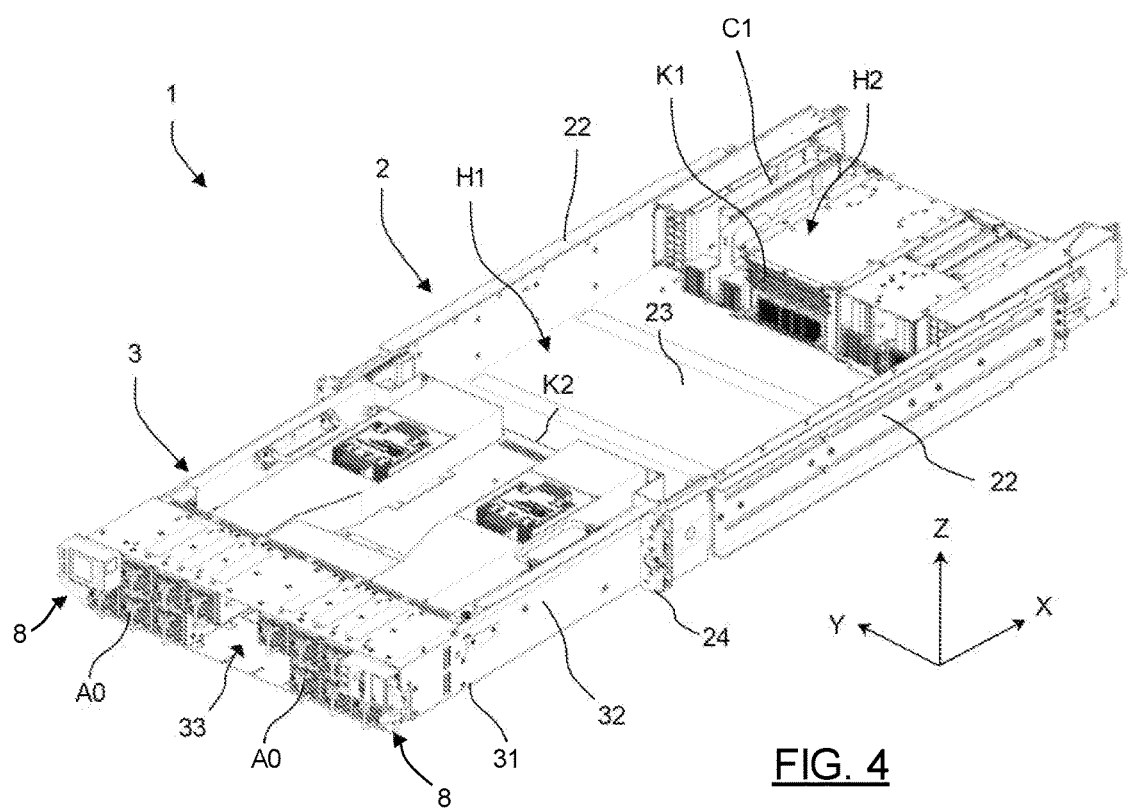
FIG. 4 is an isometric view of the computing from FIG. 3 with the internal body in the extracted position, according to one or more embodiments.

As illustrated in FIGS. 2 to 4, according to one or more embodiments, the computing unit 1 is presented in the (X, Y, Z) referential in which the X axis extends longitudinally from the front to the rear, the Y axis extends laterally from the right to the left and the Z axis extends vertically from the bottom to the top.

According to one or more embodiments of the invention, the external body 2 comprise lateral walls 22, a bottom wall 23 (see FIG. 4) and a top wall 21 defining together a housing (the top wall 21 is not represented in the FIGS. 3 and 4). As represented in FIG. 4, according to one or more embodiments, the external body 2 defines a front housing H1 where the internal body 3 can be mounted and a back housing H2 where primary electronic components C1 are located, for example, at least one mother board and components secured to the mother board such as processors, Dual In-Line Memory Module (DIMM), etc. The internal body 3 is configured to be releasably coupled to the primary electronic components C1 of the back housing H2. The external body 2 comprises at least a first connector K1 connected to the primary electronic components C1. The first connector K1 is located at the interface between the first housing H1 and the second housing H2.

As represented in FIG. 4, according to one or more embodiments, each lateral wall 22 of the external body 2 comprises an abutment wall 24 configured to be connected to the HPC cabinet 100, for example, by screws. Each abutment wall 24 is located in a front end of the external body 2.

In at least one embodiment, as represented in FIG. 4, the computing unit 1 comprises, at each side of the internal body 3, a front lever 8 pivotally coupled to the internal body 3 for releasably coupling the internal body 3 with the external body 2. The coupling means could be different.

The internal body 3 comprises at least a second connector K2 connected to secondary electronic components A0-A3 of the internal body 3, the second connector K2 being configured to cooperate with the first connector K1 of the external body 2 when the internal body 3 is coupled with the external body 2 (See FIG. 3). The second connector K2 is located at the rear end of the internal body 3, preferably, at the rear end of the bottom tray 4.

Figure 5:
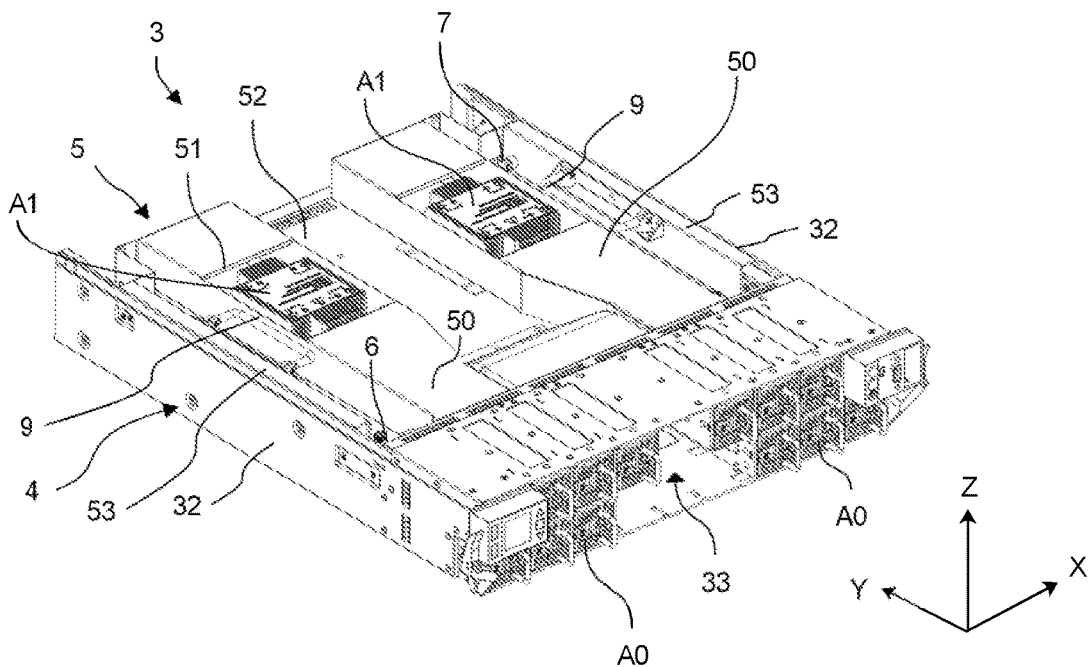
FIG. 5 is an isometric view of the internal body with the top tray engaged with the bottom tray, according to one or more embodiments.
Figure 6:
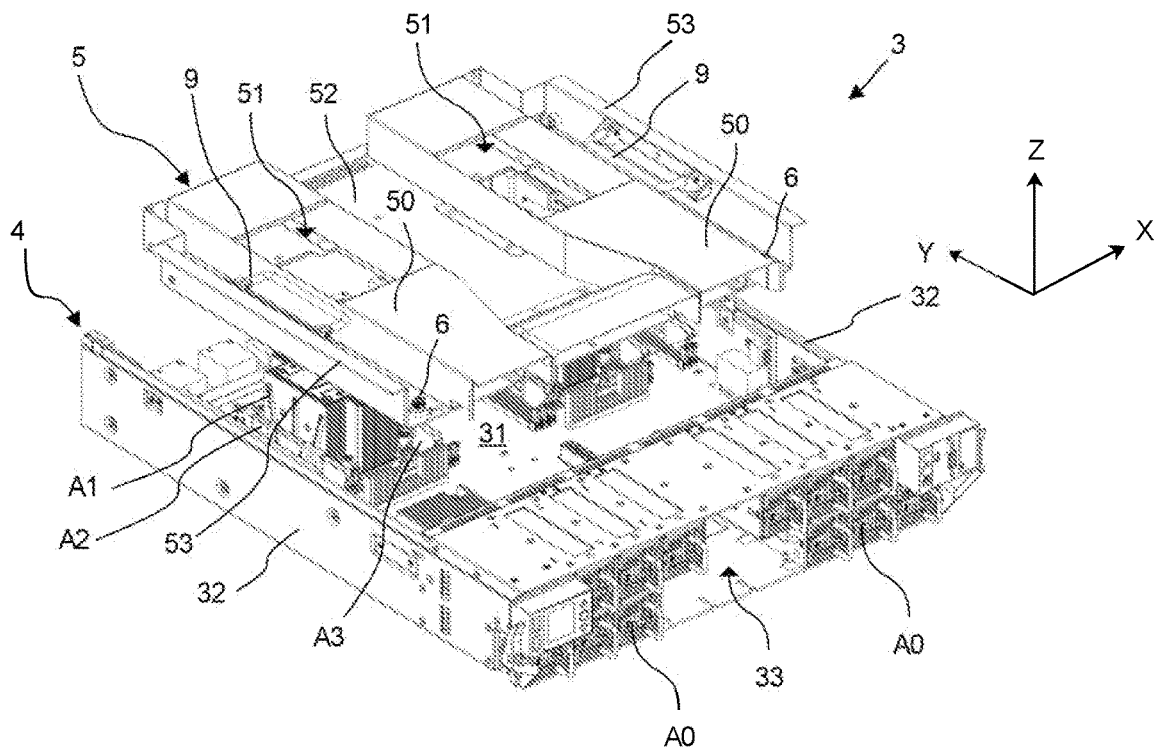
FIG. 6 is an isometric view of the internal body with the top tray disengaged from the bottom tray, according to one or more embodiments.

As represented in FIGS. 5 and 6, according to one or more embodiments, the internal body 3 comprises a bottom tray 4 and a top tray 5 which is releasably coupled with the bottom tray 4.

According to FIG. 6, in one or more embodiments, the bottom tray 4 comprises several bottom secondary components A0-A3. In at least one embodiment, the bottom secondary electronic components are in the form of fans A0, processor cooler A1, Dual In-Line Memory Module (DIMM) A2, SSD A3, etc. The fans A0 are located at the front so that air can flow from the front to the rear in the computing unit 1. In at least one embodiment, the internal body 3 comprises a front housing 33 in order to receive an interconnecting module (not represented) configured to interconnect several computing units together. The bottom tray 4 comprises a bottom wall 31 for supporting the secondary electronic components A1-A3 and side walls 32.

The top tray 5 comprises ventilation ducts 50 so that fresh air, coming from the front, can be guided to the rear of the computing unit 1 (to the primary components C1).

As illustrated in FIG. 6, according to one or more embodiments, the top tray 5 comprises a supporting wall 52, having a U-shape, and two lateral holding walls 53, extending in a (X,Y) plane, configured to vertically abut with the side walls 32 of the internal body 3/bottom tray 4. The top tray 5 covers almost completely the bottom tray 4. The top tray 5 comprises two ducts 50 configured to guide the air flow from the fans A0 to the rear of the computing unit 1. The top tray 5 also comprises two handles 9 located of each side of the top tray 5 for easily and safely removing the top tray 5 as it will be presented later.

Figure 7:
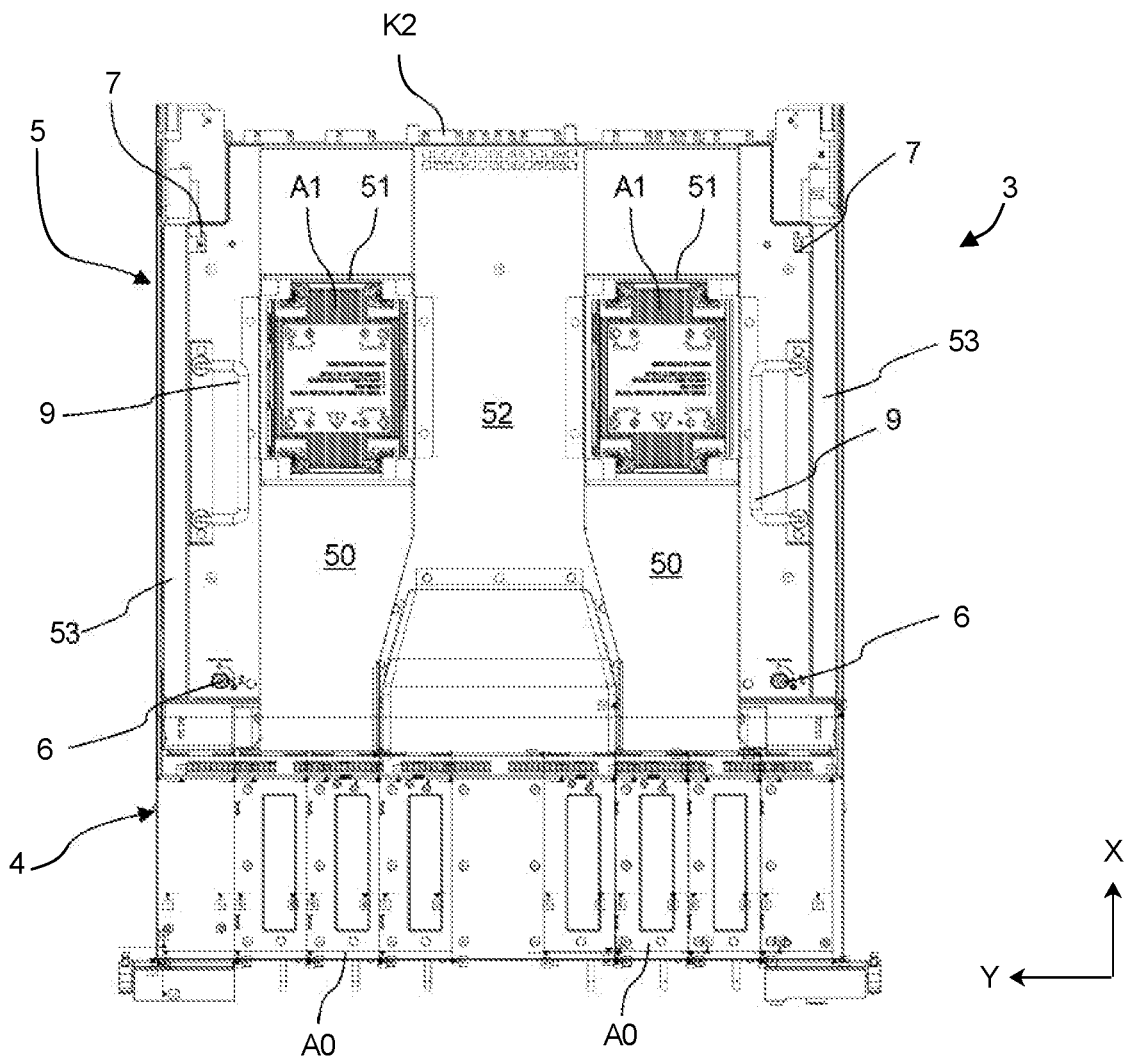
FIG. 7 is a top view of the internal body with the top tray engaged with the bottom tray, according to one or more embodiments.

As represented in FIG. 7, according to one or more embodiments, the internal body 3 comprises manual coupling members 6, 7, accessible from the top of the top tray 5, coupling releasably the top tray 5 with the bottom tray 4. In at least one embodiment, the top tray 5 comprises two front coupling members 6 (one at each side of the top tray 5) and two rear coupling members 7 (one at each side of the top tray 5). The coupling members 6, 7 are located at each corner of the top tray 5 so that the coupling is stable and optimal. By definition, manual coupling members don't require tools to be manipulated by a user.

In at least one embodiment, each front coupling member 6 is a lock rotating member, preferably, a thumb screw. The lock rotating member 6 comprises a head which is rotatable according to a vertical axis Z between an engaged position and a disengaged position. The two positions are spaced apart by 90° in one or more embodiments. The head is linked to a protruding pin which cooperates with an opening formed in the bottom tray 4. In the engaged position, the pin is locked in the bottom tray 4 and the top tray 5 cannot be removed vertically. In at least one embodiment, the use of lock rotating member allows to tighten the top tray 5 to the bottom tray 5 in the engaged position. In the disengaged position, the pin is free in the bottom tray 4 and the top tray 5 can be removed vertically. In short, the orientation of the head modifies the orientation of the pin to engage/disengage the lock rotating member 6. The lock rotating members 6 are located in the front portion of the top tray 5 to be easily accessible by a user for rotating them.

In at least one embodiment, each rear coupling member 7 is a vertical pushing/pulling member, for example, a spring actuated plunger.

In the engaged position, the plunger is locked in the bottom tray and the top tray 5 cannot be removed vertically. In the disengaged position, the plunger is free in the bottom tray and the top tray can be removed vertically.

The vertical pushing/pulling members 7 are located in the rear portion of the top tray 5 because they only need to be pushed/pulled to be disengaged, the user doesn't need to grab them in order to rotate them. Even if the access is more complex, they can still be actuated. Once all the coupling members 6, 7 are in the disengaged position, the top tray 5 can be vertically removed by using the two handles 9. Therefore, the top tray 5 can be maintained horizontally during the removal which avoids damaging the bottom secondary electronic components of the internal body 3.

Figure 8:
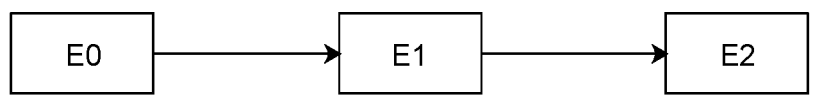
FIG. 8 is a schematic diagram of the method for accessing a bottom secondary component from the internal body of the computing unit, according to one or more embodiments.

It will now be described a method for accessing a bottom secondary electronic component from the internal body 3 in order to proceed to a maintenance operation, by way of one or more embodiments. According to FIG. 8, in at least one embodiment, in the initial position (E0), the internal body 3 is located in the housing H1 from the external body 2 (see FIG. 3). As illustrated in FIG. 4, the user then pulls (E1) the internal body 3 out from the external body 2, for example, by using levers 8.

If the user wants to access a bottom secondary component, for example a DIMM memory A2, the user uncouples (E2) the top tray 5 from the bottom tray 4 by acting on the manual coupling members 6, 7. Firstly, the user rotates the front lock rotating members 6, easily accessible, to unlock the front part of the top tray 5. Then, the user pushes the rear vertical pushing/pulling members 7 to unlock the rear part of the top tray 5. The top tray 5 can then be lifted from the bottom tray 4 by using the handles 9 to directly access the bottom secondary components A1-A3. A DIMM memory A2 can be replaced without using any tool. The internal body 3 can be pushed back into the external body 2 in order to connect the connectors K1, K2. The computing unit 1 is united and can be used again.

All terminologies used herein are for purposes of describing embodiments and examples and should not be construed as limiting the invention. As used herein, the singular forms "a," "an," and "the" are configured to include the plural forms as well, unless the context clearly indicates otherwise. Furthermore, to the extent that the terms "including," "includes," "having," "has," "with," or variants thereof, are used in either the detailed description and/or the claims, such terms are configured to be inclusive in a manner similar to the term "comprising."

Unless otherwise defined, all terms (including technical and scientific terms) used herein have the same meaning as commonly understood by the person skilled in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly defined herein.

While aspects of the invention have been particularly shown and described with reference to the embodiments above, it will be understood by those skilled in the art that various additional embodiments may be contemplated by the modification of the disclosed methods without departing from the spirit and scope of what is disclosed. Such embodiments should be understood to fall within the scope of the invention as determined based upon the claims and any equivalents thereof.

What is claimed is:

1. A computing unit configured to be mounted in a High-Performance Computing (HPC) cabinet, defining a plurality of vertically stacked sockets, the computing unit comprising: an external body, comprising primary electronic components, configured to engage with at least one vertically stacked socket of the plurality of vertically stacked sockets, wherein the external body further comprises at least a bottom wall, a top wall and two lateral walls, wherein said bottom wall, said top wall and said two lateral walls together define a first housing that is opened from a front end of the first housing, wherein each lateral side of the two lateral walls comprises an abutment wall configured to be secured directly to the HPC cabinet, wherein the external body further comprises a second housing at a rear end of said external body, wherein the primary electronic components are located in said second housing, and at least a first connector connected to the primary electronic components, wherein the at least the first connector is located at a front end of the second housing and at an interface between the first housing and the second housing, an internal body mounted within the external body, comprising secondary electronic components, being releasably coupled with the external body in order to allow extraction of the internal body when the external body is secured fixedly to the HPC cabinet, wherein the internal body further comprises at least a second connector connected to the secondary electronic components, the second connector being configured to cooperate with the first connector when the internal body is coupled with the external body, a bottom tray, comprising bottom secondary electronic components, a top tray comprising at least one duct for conducting an air flow from a front of the computing unit to a rear of the computing unit, a front portion and a rear portion, a supporting wall that is a U-shape, two lateral holding walls extending in an x,y plane configured to vertically abut with side walls of the bottom tray, and two channels extending in a y-direction and recessed from the two lateral holding walls and the at least one air duct, a plurality of manual coupling members, accessible from a top of the top tray, releasably coupling the top tray with the bottom tray, wherein each manual coupling member of the plurality of manual coupling members is located in the two channels and at each corner of the top tray, such that two coupling members of the plurality of manual coupling members are each located at said each corner of said front portion of the top tray and additional two coupling members of said plurality of manual coupling members are each located at said each corner of said rear portion of the top tray; wherein the top wall of the external body covers the top tray of the internal body.

2. The computing unit according to claim 1, wherein the two coupling members of the plurality of manual coupling members located at said each corner of said front portion of the top tray are lock rotating members.

3. The computing unit according to claim 2, wherein each lock rotating member of said lock rotating members is a thumb screw.

4. The computing unit according to claim 1, wherein said additional two coupling members of the plurality of manual coupling members located at said each corner of said rear portion of the top tray are vertical pushing/pulling members.

5. The computing unit according to claim 1, wherein the top tray is passive and is exempted of electronic components.

6. The computing unit according to claim 1, wherein the top tray further comprises at least one handle located at two opposite sides.

7. A method for accessing a bottom secondary electronic component of a bottom tray of an internal body of a computing unit configured to be mounted in a High-Performance Computing (HPC) cabinet, defining a plurality of vertically stacked sockets, wherein the computing unit comprises: an external body, comprising primary electronic components, configured to engage with at least one vertically stacked socket of the plurality of vertically stacked sockets, wherein the external body further comprises at least a bottom wall, a top wall and two lateral walls, wherein said bottom wall, said top wall and said two lateral walls together define a first housing that is opened from a front end of the first housing, wherein each lateral side of the two lateral walls comprises an abutment wall configured to be secured directly to the HPC cabinet, wherein the external body further comprises a second housing at a rear end of said external body, wherein the primary electronic components are located in said second housing, and at least a first connector connected to the primary electronic components, wherein the at least the first connector is located at a front end of the second housing and at an interface between the first housing and the second housing, the internal body mounted within the external body, comprising secondary electronic components, being releasably coupled with the external body in order to allow extraction of the internal body when the external body is secured fixedly to the HPC cabinet, wherein the internal body further comprises at least a second connector connected to the secondary electronic components, the second connector being configured to cooperate with the first connector when the internal body is coupled with the external body, the bottom tray, comprising the bottom secondary electronic component, a top tray comprising at least one duct for conducting an air flow from a front of the computing unit to a rear of the computing unit, a front portion and a rear portion, a supporting wall that is a U-shape, two lateral holding walls extending in an x,y plane configured to vertically abut with side walls of the bottom tray, two channels extending in a y-direction and recessed from the two lateral holding walls and the at least one duct, and a plurality of manual coupling members, accessible from a top of the top tray, releasably coupling the top tray with the bottom tray, wherein each manual coupling member of the plurality of manual coupling members is located in the two channels and at each corner of the top tray, such that two coupling members of the plurality of manual coupling members are each located at said each corner of said front portion of the top tray and additional two coupling members of said plurality of manual coupling members are each located at said each corner of said rear portion of the top tray, wherein the internal body is located in the first housing of the external body, and wherein the top wall of the external body covers the top tray of the internal body; wherein the method comprises: pulling the internal body out from the first housing of the external body, wherein the bottom secondary electronic component of the bottom tray is covered by the top tray, and uncoupling the top tray from the bottom tray of the internal body by manually acting on the plurality of manual coupling members in order to access the bottom secondary electronic component of the bottom tray.

8. The computing unit according to claim 1, wherein the at least one duct of the top tray comprises two ducts.

9. The computing unit according to claim 4, wherein each vertical pushing/pulling member of the vertical pushing/pulling members is a spring actuated plunger.

10. The computing unit according to claim 3, wherein each lock rotating member of said lock rotating members comprises a head that is rotatable according to a vertical axis Z between an engaged position and a disengaged position, such that the engaged position and the disengaged position are spaced apart by 90°.

11. The computing unit according to claim 10, wherein said head is linked to a protruding pin which cooperated with an opening formed in the bottom tray, such that an orientation of the head modifies an orientation of the protruding pin to engage and disengage the each lock rotating member from said engaged position to said disengaged position, wherein in the engaged position, the protruding pin is locked in the bottom tray and the top tray cannot be removed vertically, and such that in the disengaged position the pin is free in the bottom tray and the top tray is removed vertically.

* * * * *